United States Patent [19]

Nebel et al.

[11] Patent Number: 5,798,657
[45] Date of Patent: Aug. 25, 1998

[54] BIDIRECTIONAL DRIVER CIRCUIT FOR PCI BUS SYSTEMS

[75] Inventors: Gerhard Nebel, Immenstadt, Germany; Vincent Frechet, Louveciennes, France; Doris Schmitt-Landsiedel, Ottobrunn, Germany

[73] Assignee: Siemens Aktiengesellschaft, Munich, Germany

[21] Appl. No.: 722,485

[22] Filed: Sep. 27, 1996

[30] Foreign Application Priority Data

Sep. 27, 1995 [DE] Germany ............... 195 36 020.6

[51] Int. Cl.$^6$ ............ H03K 17/10; H03K 19/094
[52] U.S. Cl. ............... 326/81; 326/86; 326/68
[58] Field of Search ............. 326/83, 86, 84, 326/80, 81, 68

[56] References Cited

U.S. PATENT DOCUMENTS 5,378,943  1/1995  Dennard ................ 326/81
5,465,054  11/1995 Erhart .................. 326/81
5,532,621  7/1996  Kobayashi et al. ........ 326/81
5,650,742  7/1997  Hirano ................. 326/81

OTHER PUBLICATIONS

IEEE 1992 Symposium on VLSI Circuits Digest of Technical Papers–"Highly Reliable Process Insensitive 3.3V–5V Interface Circuit"–Wada et al –pp. 90–91.
IEEE Journal of Solid-State Circuits –vol. 26, No. 7, Jul. 1991, pp. 1003–1009, "Circuit Techniques for 1.5–3.6V Battery–Operated 64 mb DRAM", Nakagome et al.

Primary Examiner—Edward P. Westin
Assistant Examiner—Richard Roseen
Attorney, Agent, or Firm—Hill & Simpson

[57] ABSTRACT

The bidirectional driver circuit for PCI bus system involves minimal circuit outlay. It is manufactured in a 3.3 technology and is essentially also operated only with 3.3 V, but is suited for a 5 V signal environment. The driver circuit has at least one selection logic (AL), a control circuit (A), a p-channel MOS transistor (M113), a first, second and third n-channel MOS transistor (M110, M111, M112). The advantage of the driver circuit is in its minimal circuit outlay.

8 Claims, 2 Drawing Sheets

BIDIRECTIONAL DRIVER CIRCUIT FOR PCI BUS SYSTEMS

BACKGROUND OF THE INVENTION

In modern CMOS processes, current minimal channel lengths gate oxide thicknesses are possible, which no longer withstand the previously standard operating voltage for digital circuits of 5 V. For this reason, a reduced operating voltage of 3.3 V for digital circuits has gained acceptance. However, since for compatibility an abrupt conversion is not possible, during the transition period circuits are required that can operate with both operating voltages or, respectively, can correctly process the different signal levels for the same logical value. The PCI bus takes these two operating voltages into account and defines circuit levels, load capacitances, time relations, etc., for both 5 V and 3.3 V signal voltages. The plug connections on a motherboard provide both operating voltages, as well as a marking that defines the signal level used on the motherboard. However, this signal level defines only the voltage values with which data is exchanged at the bus, and does not concern the respective operating voltage of the individual circuits on the various plug cards.

The article by Y. Nakagome et al., "Circuit Techniques for 1.5–3.6 V Battery-Operated 64 MB DRAM," IEEE J. of Solid-State Circuits, vol. 26, no. 7, pp. 1003–1010, Jul. 1991, presents for example a circuit under the designation "5 V/3.3 V level converter," which enables the use of a 3.3 V technology for 5 V input and output signals. In the 5 V signal environment, the PCI bus operates with TTL levels at which for a logical one only 2.4 V are required at the output. By this means it is possible to operate the circuit with only 3.3 V, since for the level of a logical one 5 V are not required. However, since other bus users can supply 5 V for the level of a logical one, and may not thereby be shorted, the voltage at the bus cannot be limited to 3.3 V. In Y. Nakagome et al., the comparatively high expense of a "true 5V signal circuit" can be seen, in particular from FIG. 4, since due to the 5 volts this circuit respectively has two current paths, each having four transistors connected in series, which moreover cause a relatively slow switching characteristic.

SUMMARY OF THE INVENTION

It is an object of the present invention to provide a bidirectional driver circuit for PCI bus systems in which in the high-ohm state (tristate) external signal voltages up to 5 V are possible, and at the same time a current is prevented from flowing in the driver circuit, and in which this ensues with the lowest possible expense, e.g. without the very costly arrangements for the generation of true 5 V signals.

In general terms the present invention is a driver circuit having a control logic, a control circuit, a p-channel MOS transistor, a first n-channel enhancement-mode type MOS transistor, a second n-channel MOS transistor and a third n-channel MOS transistor. The control logic is supplied with a first supply voltage and a reference potential. The control logic has a blocking input and a signal input, which also is the input of the driver.

The control logic has an output for a first control signal and an output for a second control signal, inverse to the first. The gate terminal of the p-channel MOS transistor is charged with the first control signal and the gate of the third n-channel MOS transistor is charged with the second control signal. The first output signal of the control logic is connected to a second supply voltage via two diodes connected in series and via a current source transistor connected thereto in series. The second supply voltage is higher than the first supply voltage. A connection node is connected between one of the two diodes. The current source transistor is connected with the input of a CMOS inverter. A gate terminal of the current source transistor is connected to the first supply voltage. An output of the control circuit is connected to the gate of the first n-channel MOS transistor, and the gate terminal of the second n-channel MOS transistor is connected to the first supply voltage. A first terminal of the p-channel MOS transistor is connected with the first supply voltage and a second terminal of this transistor is connected with a first terminal of the first n-channel MOS transistor, whose second terminal is connected to the output of the driver circuit. A first terminal of the second n-channel MOS transistor is connected to the output of the driver circuit and a second terminal of this transistor is connected to a first terminal of the third n-channel MOS transistor, whose second terminal is connected to the reference potential.

Advantageous developments of the present invention are as follows.

A protective circuit is provided wherein the gate terminal of the first n-channel MOS transistor is connected via a diode to the emitter of a bipolar transistor, whose base is connected with the output of the driver circuit via a resistor and whose collector is connected directly to the reference potential.

A diode, polarized in the blocking direction, is connected between the second supply voltage and the output of the driver circuit, and another diode polarized in the blocking direction is connected between the output of the driver circuit and the reference potential.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
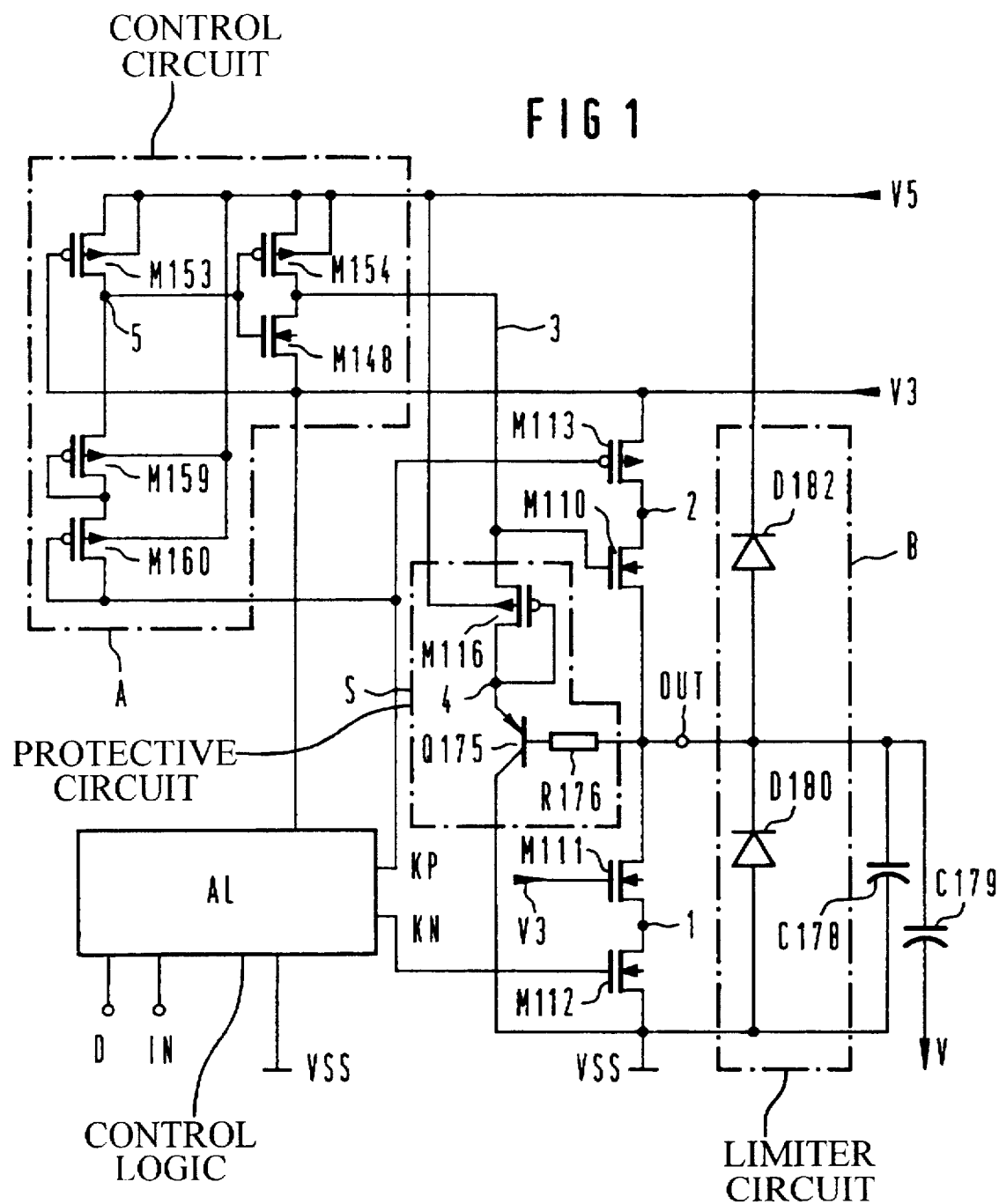
FIG. 1 depicts an inventive driver circuit having a control logic.

FIG. 1 shows an inventive driver circuit having a control logic AL shown as a block diagram, a control circuit A, a protective circuit S, a limiter circuit B and four MOS field effect transistors M110, M111, M112, M113 connected in series, whereby the transistors M110, M111 and M112 are n-channel MOS transistors and transistor M113 is a p-channel MOS transistor. At least the MOS field effect transistor M110 is an enhancement mode n-channel MOS transistor.

A first terminal of the transistor M112 is connected to the reference potential (ground) VSS, and a second terminal is connected via a node 1 with a first terminal of the transistor M111, whose second terminal is connected with a first terminal of the transistor M110 via an output node OUT of the driver. A second terminal of the transistor M110 is connected via a node 2 with a first terminal of the transistor M113, whose second terminal is connected with the 3.3 V supply voltage V3.

The control logic AL is connected with (reference potential VSS and is supplied with 3.3 V. The control logic AL has a signal input IN and a blocking input D (disable), and produces two output signals KP and KN. The signals KP and KN are respectively zero in the "pull-up" state, are respectively one in the "pull-down" state, and in the "tristate" state are inverse to one another, whereby KP=1 and KN=0. An example of the construction of the control logic is described below in connection with FIG. 2.

The control circuit A has four p-channel MOS transistors M153, M154, M159 and M160, as well as an n-channel MOS transistor M148, whereby all substrate terminals of the p-channel MOS transistors are supplied with 5 V via a line V5. A first terminal of the transistor M153 is connected to the line V5, and a second terminal of the transistor M153 is connected via a connection node 5 to a first terminal of the transistor M159, whose second terminal is connected to the gate of the transistor M159 and to a first terminal of the transistor M160. A second terminal of the transistor M160 is connected to the gate of the transistor M160 and to the output signal KP of the control logic AL. The gate terminal of the transistor M153 is connected to the line V3, thus with 3.3 V. The node 5 is connected to the gate terminals of the series-connected transistors M154 and M148. A first terminal of the transistorM154 is connected to the line V5 and a second terminal of the transistor M154 is connected via a node 3 to a first terminal of the transistor M148, whose second terminal is connected to the line V3, and whereby the node 3 is also the output of the control circuit A. The gate of the transistor M110 is connected to the node 3 and the gate of the transistor M111 is at 3.3 V. The gate of the transistor M113 is connected to the signal KP and the gate of the transistor M112 is connected to the signal KN.

The protective circuit S has a p-channel MOS transistor M166, whose first terminal is connected to the node 3 and whose second terminal and gate terminal are connected via a node 4 to an emitter terminal of a bipolar transistor Q175. The base of the bipolar transistor Q175 is connected via a resistor R176 to the output OUT, and the collector terminal of this transistor is connected to the reference potential VSS.

In a limiter circuit B, a diode D182 is connected in the blocking direction between the output OUT and the line V5 for the 5 V supply, and a diode D180 is likewise connected in the blocking direction between the output OUT and reference potential.

Moreover, a load capacitor C178 is connected between the output and reference potential VSS (or, respectively, an internal ground), and another load capacitor C179 is connected between the output and an external ground V, which is connected via bond wires with the internal ground VSS.

If a logical one is present at the blocking input D, the output signal KP is a logical one, and the output signal KN is a logical zero, whereby the switch transistors M113 and M112 are blocked, and the output OUT is in the high-ohm state (tristate).

With a logical zero at the blocking input D, the entire driver circuit operates as an inverter, i.e. a signal inverse to the signal at the input IN lies at the output OUT.

The transistor M111 prevents the drain voltage at the transistor M112, thus at the node 1, from becoming too large when the circuit is in the high-ohm state and a high voltage, up to 5.7 V, arises from outside at the output OUT. As long as the node 1 lies at low potential, the transistor M111 conducts, the potential at the node 1 exceeds a voltage of 3.3 V minus the threshold voltage of the transistor M111, the channel of the transistor M111 is cut off and in this way prevents a further increase in potential.

In the high-voltage state, and at voltages higher than 3.3 V at the output OUT, the transistor M110 prevents a current from flowing into the circuit. In this case, the gate via the transistor M148, as well as the node 2, which in this case forms the source terminal of the transistor M110, lies at 3.3 V. The gate-source voltage is accordingly zero, and the transistor M110 blocks. For the case in which a logical one is present at the output, the signal KP is a logical zero and the two transistors M159 and M160, connected from PMOS diodes, cause the node 5 to lie at about 3.3 V. The inverter, formed from the two transistors M148 and M154, thereby supplies a voltage of about 5 V at the node 3, i.e. at the gate of the transistor M110. The transistor M154 is thereby advantageously designed very small, so that the potential at the node 3 climbs only slowly. By means of the large gate-source capacitance of the transistor M110, the potential at the node 3 and at the output OUT is thus raised in parallel fashion, and in this way the gate voltage of the transistor M110 remains beneath the critical value.

For the case in which a short circuit arises at the output relates to the reference potential VSS, the voltage at the node 3 is prevented from becoming too large by the base-emitter diode of the bipolar transistor Q175 and by the transistor M166, connected as a PMOS diode M166, which both become conductive. In place of the bipolar diode of the transistor Q175, another PMOS diode can also be used. However, this has the disadvantage that the gate of the transistor of the additional PMOS diode is connected to the output, and particular ESD protective measures are thus required. In contrast, given the use of a NMOS diode, this problem does not arise, since the gate in this case is connected to the node 4. However, here an excessively high gate-bulk voltage is a problem if the output in the high-ohm state is charged with 5 V by another bus user. In this case, the NMOS diode is no longer conductive and the bulk voltage punches through almost completely up to under the gate oxide, since no channel is formed under the gate.

The resistor R176 serves as a current limiter, and shields the p-channel MOS transistor M166 in relation to the output OUT, so that a minimal ESD (electrostatic discharge) protective structure is sufficient against the operating voltage in the 5 V.

Gate bulk voltages of ±5 V can arise at the transistors M110 and M160. However, since these transistors are always conductive in the corresponding cases, the voltage is divided between the space-charge zone and the gate oxide, due to the channel under the gate. The voltage effectively present at the gate is accordingly always smaller than the external gate-bulk voltage.

At the PCI bus, voltages up to +11 V and −5V can arise due to reflections at the non-terminated ends of the line. These voltages are limited to values between −0.7 V to +5.7 V with the diodes D182 and D180 of the limiter circuit.

The protective circuit S ensures that 5 V is not present in an impermissible way between the gate and the source of the transistor M110 when the output OUT is shorted and the gate of M110 thereby lies at high potential through the control circuit A.

Figure 2:
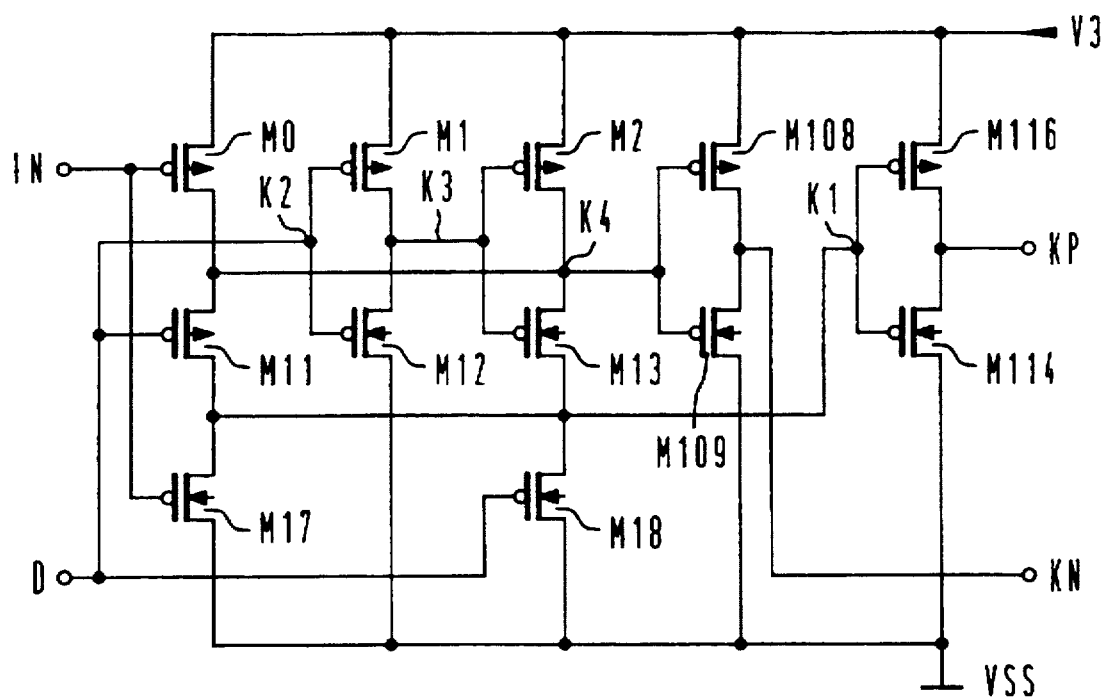
FIG. 2 is a circuit diagram for the control logic of FIG. 1.

FIG. 2 shows as an example an advantageous circuit for the control logic AL, having six p-channel MOS transistors M0, M11, M1, M2, M108 and M116, as well as six n-channel MOS transistors M17, M12, M13, M18, M109 and M114. A first terminal of the transistor M0 is connected to the line V3, a second terminal of the transistor M0 is connected to a first terminal of the transistor M11 via a node K4, and the gate terminal of the transistor M0 is connected to the input IN. A second terminal of the transistor M11 is connected via a node K1 to a first terminal of the transistor M17, whose gate is likewise connected to the input IN and whose second terminal is connected to the reference potential VSS. The blocking terminal D is connected to the gate of the transistor M11. A first terminal of the transistor M1 is connected to the line V3 and a second terminal of the transistor M1 is connected via a node K3 to a first terminal of the transistor M12, whose second terminal is connected to the reference potential VSS and whose gate is connected to the blocking terminal D in common with the gate of the transistor M1. A first terminal of the transistor M2 is connected to the line V3 and a second terminal is connected via the node K4 to a first terminal of the transistor M13, whose second terminal is connected to the reference potential VSS via the transistor M18. The gate terminals of the transistors M2 and M13 are connected via the nodes K3, and the gate terminal of the transistor M18 is connected to the blocking terminal D. A first terminal of the transistor M108 is connected to the line V3, and a second terminal is connected via the node for the signal KN to a first terminal of the transistor M109, whose second terminal is connected to reference potential and whose gate terminal is connected to the node K4 in common with the gate terminal of the transistor M108. A first terminal of the transistor M116 is connected to the supply line V3, and a second terminal of the transistor M116 is connected via a node for the signal KP to a first terminal of the transistor M114, whose second terminal is connected to the reference potential VSS, and whose gate terminal is connected to the gate terminal of the transistor M116 in common with the node K1.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A driver circuit comprising:

a control logic, a control circuit, a p-channel MOS transistor, a first n-channel enhancement-mode type MOS transistor, a second n-channel MOS transistor and a third n-channel MOS transistor;

the control logic being supplied with a first supply voltage and a reference potential, the control logic having a blocking input and a signal input, which also is an input of the driver circuit;

the control logic having an output for a first control signal and an output for a second control signal, which is inverse to the first control signal, a gate terminal of the p-channel MOS transistor being charged with the first control signal and a gate of the third n-channel MOS transistor being charged with the second control signal;

the first output of the control logic being supplied with a second supply voltage via the control circuit by two diodes connected in series and by a current source transistor connected thereto in series, the second supply voltage being higher than the first supply voltage, a connection node, which is connected between one of the two diodes and the current source transistor, connected to an input of a CMOS inverter in the control circuit, and a gate terminal of the current source transistor is connected to the first supply voltage;

the control circuit having an output connected to a gate terminal of the first n-channel MOS transistor, a gate terminal of the second n-channel MOS transistor being connected to the first supply voltage;

a first terminal of the p-channel MOS transistor connected to the first supply voltage and a second terminal of the p-channel MOS transistor connected to a first terminal of the first n-channel MOS transistor, a second terminal of the first n-channel MOS transistor connected to the output of the driver circuit; and a first terminal of the second n-channel MOS transistor is connected to the output of the driver circuit and a second terminal of the second n-channel MOS transistor connected to a first terminal of the third n-channel MOS transistor, a second terminal of the third n-channel MOS transistor connected to the reference potential.

2. The driver circuit according to claim 1, wherein the driver circuit further comprises a protective circuit having a bipolar transistor, a gate terminal of the first n-channel MOS transistor being connected via a diode to an emitter of the bipolar transistor, a base of the bipolar transistor being connected to the output of the driver circuit via a resistor and a collector of the bipolar transistor being connected directly to the reference potential.

3. The driver circuit according to claim 1, wherein a first diode, polarized in a blocking direction is connected between the second supply voltage and the output of the driver circuit, and wherein a second diode polarized in a blocking direction is connected between an output of the driver circuit and the reference potential.

4. A driver circuit, comprising:

a p-channel MOS transistor, a first n-channel enhancement-mode type MOS transistor, a second n-channel MOS transistor and a third n-channel MOS transistor;

driver circuit input and driver circuit output; control logic supplied with a first supply voltage and a reference potential, the control logic having a blocking input and a signal input, which is also the driver circuit input, the control logic having a first output for a first control signal and a second output for a second control signal, which is inverse to the first control signal, a gate terminal of the p-channel MOS transistor charged with the first control signal and a gate of the third n-channel MOS transistor charged with the second control signal;

a control circuit having two diodes connected in series and a current source transistor connected thereto in series, having a connection node that is connected between one of the two diodes and the current source transistor, having a CMOS inverter having an input connected to the connection node, a gate terminal of the current source transistor connected to the first supply voltage and a further terminal connected to a second supply voltage, the second supply voltage being higher than the first supply voltage, the first output of the control logic being supplied with the second supply voltage via the two diodes and the current source transistor;

the control circuit having an output connected to a gate of the first n-channel MOS transistor, and a gate terminal of the second n-channel MOS transistor connected to the first supply voltage;

a first terminal of the p-channel MOS transistor connected to the first supply voltage and a second terminal of the p-channel MOS transistor connected to a first terminal of the first n-channel MOS transistor, a second terminal of the first n-channel MOS transistor connected to the driver circuit output; and a first terminal of the second n-channel MOS transistor connected to the driver circuit output and a second terminal of the second n-channel MOS transistor connected to a first terminal of the third n-channel MOS transistor, a second terminal of the third n-channel MOS transistor connected to the reference potential.

5. The driver circuit according to claim 4, wherein the driver circuit further comprises a protective circuit having a bipolar transistor, a gate terminal of the first n-channel MOS transistor being connected via a diode to an emitter of the bipolar transistor, a base of the bipolar transistor being connected to the output of the driver circuit via a resistor and a collector of the bipolar transistor being connected directly to the reference potential.

6. The driver circuit according to claim 4, wherein a first diode, polarized in a blocking direction, is connected between the second supply voltage and the output of the driver circuit, and wherein a second diode polarized in a blocking direction is connected between an output of the driver circuit and the reference potential.

7. A driver circuit, comprising:

a p-channel MOS transistor, a first n-channel enhancement-mode type MOS transistor, a second n-channel MOS transistor and a third n-channel MOS transistor;

driver circuit input and driver circuit output;

control logic supplied with a first supply voltage and a reference potential, the control logic having a blocking input and a signal input, which is also the driver circuit input, the control logic having a first output for a first control signal and a second output for a second control signal, which is inverse to the first control signal, a gate terminal of the p-channel MOS transistor charged with the first control signal and a gate of the third n-channel MOS transistor charged with the second control signal;

a control circuit having two diodes connected in series and a current source transistor connected thereto in series, having a connection node that is connected between one of the two diodes and the current source transistor, having a CMOS inverter having an input connected to the connection node, a gate terminal of the current source transistor connected to the first supply voltage and a further terminal connected to a second supply voltage, the second supply voltage being higher than the first supply voltage, the first output of the control logic being supplied with the second supply voltage via the two diodes and the current source transistor;

the control circuit having an output connected to a gate of the first n-channel MOS transistor, and a gate terminal of the second n-channel MOS transistor connected to the first supply voltage;

a first terminal of the p-channel MOS transistor connected to the first supply voltage and a second terminal of the p-channel MOS transistor connected to a first terminal of the first n-channel MOS transistor, a second terminal of the first n-channel MOS transistor connected to the driver circuit output;

a first terminal of the second n-channel MOS transistor connected to the driver circuit output and a second terminal of the second n-channel MOS transistor connected to a first terminal of the third n-channel MOS transistor, a second terminal of the third n-channel MOS transistor connected to the reference potential;

a protective circuit having a bipolar transistor, a gate terminal of the first n-channel MOS transistor being connected via a diode to an emitter of the bipolar transistor, a base of the bipolar transistor connected to the output of the driver circuit via a resistor and a collector of the bipolar transistor being connected directly to the reference potential.

8. The driver circuit according to claim 7, wherein a first diode, polarized in a blocking direction is connected between the second supply voltage and the output of the driver circuit, and wherein a second diode polarized in a blocking direction is connected between an output of the driver circuit and the reference potential.

* * * * *